United States Patent
Gururajarao

(10) Patent No.: US 8,981,815 B2
(45) Date of Patent: Mar. 17, 2015

(54) LOW POWER CLOCK GATING CIRCUIT

(71) Applicant: MediaTek Singapore Pte. Ltd., Singapore (SG)

(72) Inventor: Sumanth Katte Gururajarao, Dallas, TX (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/218,998

(22) Filed: Mar. 19, 2014

(65) Prior Publication Data

US 2014/0292372 A1 Oct. 2, 2014

Related U.S. Application Data

(60) Provisional application No. 61/807,043, filed on Apr. 1, 2013.

(51) Int. Cl.
*H03K 19/00* (2006.01)
(52) U.S. Cl.
CPC .................................. *H03K 19/0013* (2013.01)
USPC ............................................... 326/95; 326/93
(58) Field of Classification Search
None
See application file for complete search history.

(56) References Cited

U.S. PATENT DOCUMENTS

| | | | | |
|---|---|---|---|---|
| 3,997,800 A * | 12/1976 | Bain | | 327/293 |
| 6,204,695 B1 * | 3/2001 | Alfke et al. | | 326/93 |
| 6,583,648 B1 * | 6/2003 | Cai | | 326/93 |
| 8,030,982 B2 * | 10/2011 | Datta et al. | | 327/291 |
| 8,390,328 B2 * | 3/2013 | Myers et al. | | 326/93 |
| 8,575,965 B2 * | 11/2013 | Liu et al. | | 326/98 |
| 2011/0242413 A1 * | 10/2011 | Azzopardi | | 348/512 |
| 2012/0286824 A1 * | 11/2012 | Myers et al. | | 326/93 |

* cited by examiner

*Primary Examiner* — Crystal L Hammond
(74) *Attorney, Agent, or Firm* — Winston Hsu; Scott Margo

(57) ABSTRACT

A clock gating circuit for generating a clock enable signal with respect to a clock input signal and a logic enable signal includes: a first plurality of transistors for receiving at least the logic enable signal and generating a first output; a second plurality of transistor for receiving at least the first output and generating a second output; a third plurality of transistors for receiving at least the second output and an inverted second output; and an AND gate circuit, for receiving the second output and generating the clock enable signal when the logic enable signal is at logic 1. One transistor of the first plurality of transistors, the second plurality of transistors and the third plurality of transistors, respectively, receives the clock input signal at its gate.

4 Claims, 4 Drawing Sheets

LOW POWER CLOCK GATING CIRCUIT

CROSS REFERENCE TO RELATED APPLICATIONS

This application claims priority of Provisional Application No. 61/807,043, which was filed on Apr. 1, 2013, the contents of which are included herein by reference.

BACKGROUND

Modern micro-chips employ clock gating cells for power saving. A CPU in the micro-chip is operated by a clock signal (generated by a PLL, for example), called a 'root' clock, which is used to operate blocks within the micro-chip. When a block is not required to be operated, its clock input can be gated off by connecting the root clock to a clock gating cell which generates a clock output depending on the logic level of an enable signal. Please refer to FIG. 1A, which is a diagram of a conventional clock gating cell 100. As shown in the diagram, the clock gating cell 100 comprises an active-low latch circuit 120 that receives a clock input signal and an enable input signal. The output of the latch circuit 120 is the first input of an AND logic gate 130 which is coupled to the latch circuit 120, and the clock signal is the second input of the AND gate 130. When the enable signal EN is logic 0, the clock will be gated off. When the enable signal EN is logic 1, the AND gate 130 will generate an output clock ENCK.

By only generating an output clock to certain blocks when they are required to be operated, dynamic power within the system can be saved. Even when the enable signal EN is at logic 0, however, the clock gating cell 100 itself will consume power as the clock input signal is always active. The amount of power consumed may be significant.

Please refer to FIG. 2, which is a diagram showing the internal structure of the clock gating cell 100 illustrated in FIG. 1A. Please note that, in the following descriptions, where a number of transistors are coupled together, the transistor which is coupled to the power supply will be designated as the first transistor, the next transistor will be designated as the second transistor, and so on. As shown in the diagram, the enable signal EN is input to a first transistor and a fourth transistor of a first plurality of transistors. The first transistor is coupled to a power supply and the fourth transistor is coupled to ground. The clock signal CK is input to an inverter for generating an inverted clock signal CKZ, which is then input to another inverter for generating a clock signal CK1, which will be out of phase with the original clock signal CK. The first plurality of transistors also comprises a second transistor and a third transistor, which are coupled in series between the first transistor and the fourth transistor. The gate of the second transistor receives the input CK1 and the gate of the third transistor receives the input CKZ. The drain of the second transistor and the source of the third transistors are coupled to an inverter and a second plurality of transistors, which comprises four transistors coupled in series. More specifically, the output of the first plurality of transistors is coupled to the drain of the second transistor and the source of the third transistor of the second plurality of transistors. In the second plurality of transistors, the gate of the second transistor receives the input CK1 and the gate of the third transistor receives the input CKZ. The gates of the first and fourth transistor are coupled to the output of the inverter. The AND gate receives the output of the inverter as a first input and the clock signal CK as a second input. An inverse enable clock signal ENCKZ is generated and input to an inverter, which generates the enabled clock signal ENCK.

The transistors which are circled in the diagram all receive a clock signal as an input. Even when the enable signal is at logic 0, these transistors will still toggle with the clock signal CK. In the circuit 100, out of a total of 20 transistors, 10 transistors (i.e. 50%) will toggle with the clock signal CK.

Furthermore, a typical micro-chip comprises many clock gating cells connected to the root clock. Please refer to FIG. 1B, which illustrates the connection of clock gating cells 100 to the root clock. As shown in the diagram, the CPU 170 will generate the root clock, which is input to many clock gating cells 100. As long as the CPU 170 is kept ON, all clock gating cells coupled to the root clock will have 50% of their transistors toggling even when they are not enabled. In a standard micro-chip, there may be as many as 5000 clock gating cells coupled to the root clock.

There is therefore a significant problem of power consumption in a conventional clock gating cell.

SUMMARY

A clock gating circuit for generating a clock enable signal with respect to a clock input signal and a logic enable signal is provided. The clock gating circuit comprises: a first plurality of transistors coupled in series between a power supply and ground, for receiving at least the logic enable signal and generating a first output; a second plurality of transistor coupled in series between the power supply and ground, for receiving at least the first output and generating a second output; a third plurality of transistors coupled in series between the power supply and ground, for receiving at least the second output and an inverted second output; and an AND gate circuit, for receiving the second output and generating the clock enable signal when the logic enable signal is at logic 1. One transistor of the first plurality of transistors, the second plurality of transistors and the third plurality of transistors, respectively, receives the clock input signal at its gate.

These and other objectives of the present invention will no doubt become obvious to those of ordinary skill in the art after reading the following detailed description of the preferred embodiment that is illustrated in the various figures and drawings.

DETAILED DESCRIPTION

As detailed above, standard clock gating cells will consume a lot of power even when they are not enabled. It is therefore an objective of the present invention to provide a clock gating circuit which can consume less power than a conventional clock gating circuit.

Figure 1A:
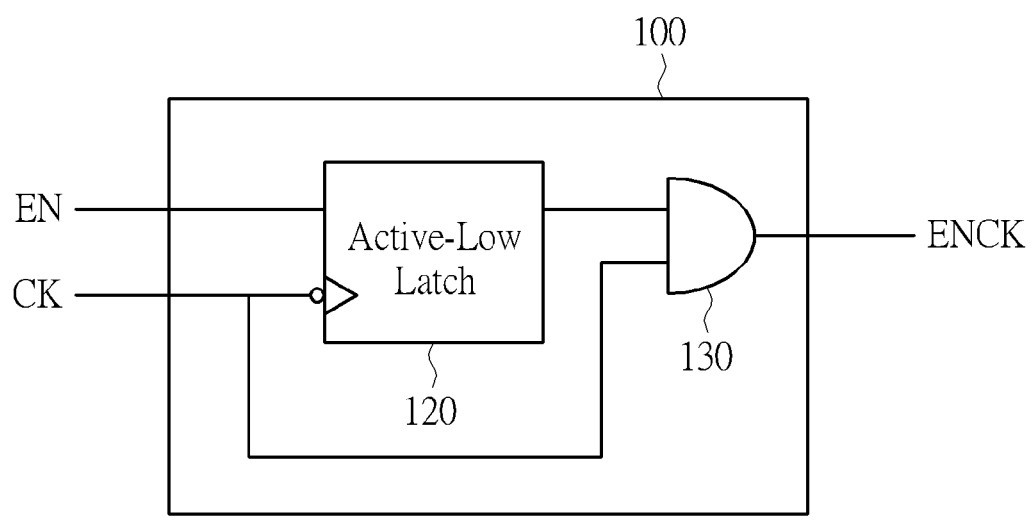
FIG. 1A is a diagram of a conventional clock gating cell.
Figure 1B:
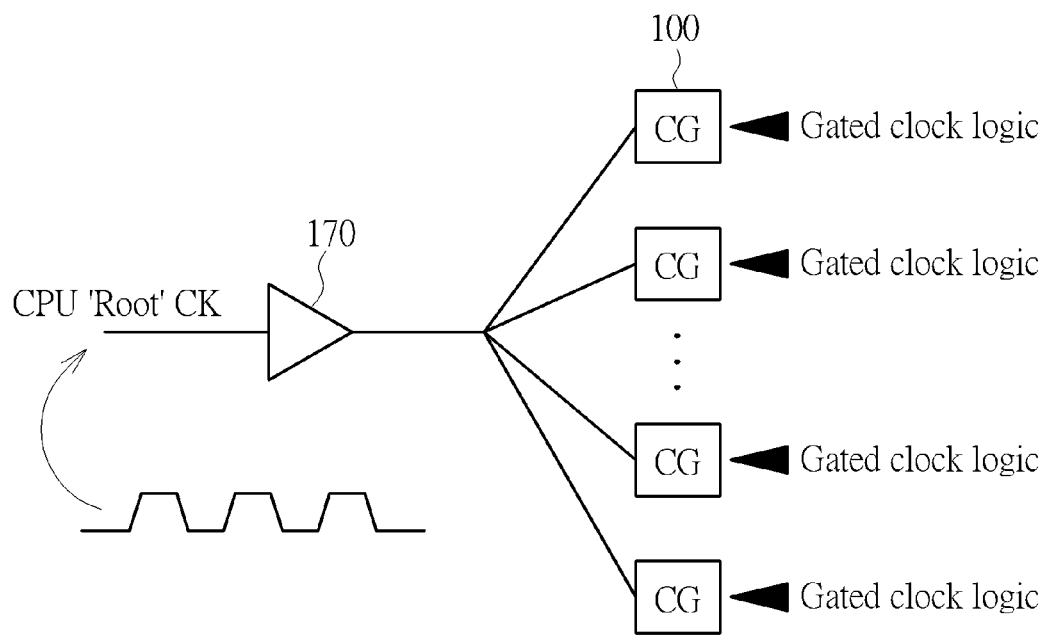
FIG. 1B is a diagram illustrating the connection of the clock gating cell shown in FIG. 1A to a root clock generated by a CPU.
Figure 2:
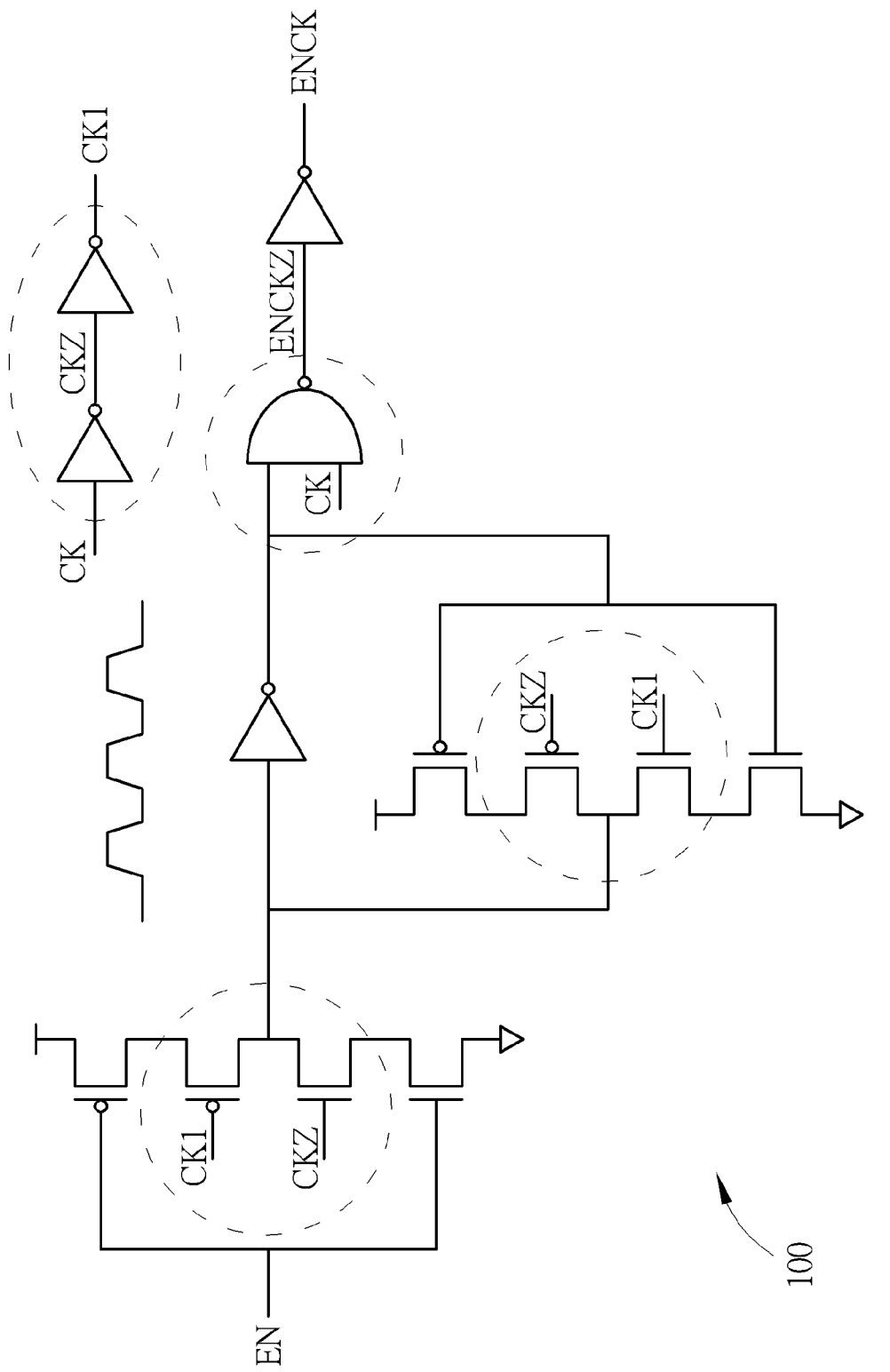
FIG. 2 is a circuit diagram of the clock gating cell shown in FIG. 1A.
Figure 3:
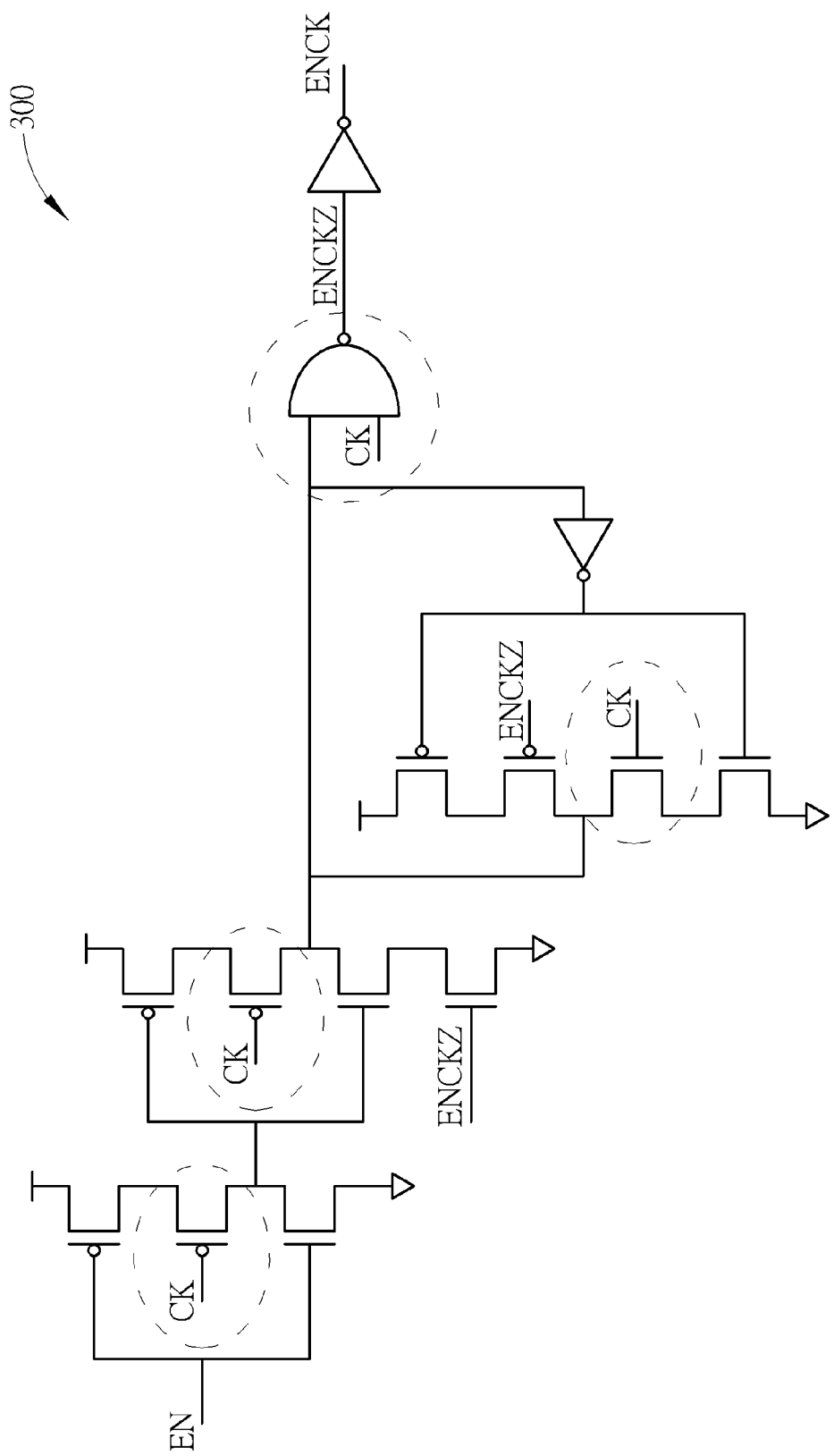
FIG. 3 is a circuit diagram of a clock gating cell according to an exemplary embodiment of the current invention.

Please refer to FIG. 3, which is a diagram of a clock gating circuit 300 according to an exemplary embodiment of the present invention. The concept of the clock gating circuit 300 is to reduce the number of clock signals which are used as inputs for transistors, in order to prevent the transistors toggling with the clock signal when the clock gating circuit 300 is not enabled. To this end, the clock gating circuit 300 does not comprise an inverter for generating an inverse clock signal CKZ and an inverter for generating a clock signal CK1 which is out of phase with the original clock signal CK.

As illustrated in FIG. 3, the clock gating circuit 300 comprises a first, second and third plurality of transistors and an AND circuit, for generating an enable clock signal ENCK. A logic enable signal EN is input to a first transistor and a third transistor of the first plurality of transistors, wherein the first transistor is coupled between a power supply and a second transistor, and the third transistor is coupled between the second transistor and ground. An output is coupled between the drain of the first transistor and the source of the second transistor and input to the gate of a second transistor and a fourth transistor of the second plurality of transistors, wherein the second transistor is coupled between a third transistor and a first transistor, and the fourth transistor is coupled between the third transistor and ground. The first transistor, which is further coupled to the power supply, receives an inverted enable signal ENCKZ at its gate. Both the second transistor of the first plurality of transistors and the third transistor of the second plurality of transistors receive the clock signal CK at their gates.

The source of the third transistor and the drain of the second transistor of the second plurality of transistors are coupled to the first input of the AND gate, and coupled to an inverter whose output is coupled to the drain of a second transistor and the source of a third transistor of the third plurality of transistors. In addition, the output of the second plurality of transistors is coupled to an inverter, whose output is coupled to the gates of a first transistor and a fourth transistor of the third plurality of transistors. The clock signal CK is input to the gate of the second transistor and the inverted enable clock signal ENCKZ is input to the gate of the third transistor. The first transistor is further coupled to the power supply and the fourth transistor is coupled to ground. The AND gate also receives the clock signal CK as its second input.

The AND gate generates the inverse enable clock signal ENCKZ, which is input to an inverter for generating the enable clock signal ENCK. The clock gating circuit 300 comprises a total of 21 transistors. Of these 21 transistors, only 5 will toggle with the clock signal CK when the enable signal EN is at logic 0. In other words, when compared with the conventional clock gating circuit 100, there is a power saving of 50%.

As will be obvious to one skilled in the art, the low power clock gating circuit 300 will not have a degraded performance or circuit area with respect to the conventional clock gating circuit 100. Further, use of full Static-CMOS ensures the clock gating circuit 300 is robust.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock gating circuit, for generating a clock enable signal with respect to a clock input signal and a logic enable signal, the clock gating circuit comprising:
a first plurality of transistors coupled in series between a power supply and ground, for receiving at least the logic enable signal and generating a first output;
a second plurality of transistor coupled in series between the power supply and ground, for receiving at least the first output and generating a second output;
a third plurality of transistors coupled in series between the power supply and ground, for receiving at least the second output and an inverted second output; and
an AND gate circuit, for receiving the second output and generating the clock enable signal when the logic enable signal is at logic 1;
wherein one transistor of the first plurality of transistors, the second plurality of transistors and the third plurality of transistors, respectively, receives the clock input signal at its gate.

2. The clock gating circuit of claim 1, wherein the AND gate circuit comprises:
an AND gate, for receiving the second output and the clock input signal and generating an inverted clock enable signal; and
an inverter circuit coupled to the output of the AND gate, for receiving the inverted clock enable signal and generating the clock enable signal.

3. The clock gating circuit of claim 2, wherein the first plurality of transistors comprises:
a first transistor having a source coupled to the power supply and a gate coupled to the logic enable signal;
a second transistor having a source coupled to the first transistor and a gate coupled to the clock input signal; and
a third transistor having a source coupled to the second transistor, a drain coupled to ground and a gate coupled to the logic enable signal;
the second plurality of transistors comprises:
a first transistor having a source coupled to the power supply and a gate coupled to the inverted clock enable signal;
a second transistor having a source coupled to the first transistor and a gate coupled to the first output;
a third transistor having a source coupled to the second transistor and a gate coupled to the clock input signal; and
a fourth transistor having a source coupled to the third transistor, a drain coupled to ground and a gate coupled to the first output;
and the third plurality of transistors comprises:
a first transistor having a source coupled to the power supply and a gate coupled to the inverted second output;
a second transistor having a source coupled to the first transistor, a drain coupled to the second output, and a gate coupled to the clock input signal;
a third transistor having a source coupled to the second transistor and a gate coupled to the inverted clock enable signal; and
a fourth transistor having a source coupled to the third transistor, a drain coupled to ground and a gate coupled to the inverted second output.

4. The clock gating circuit of claim 3, further comprising:
an inverter circuit, for receiving the second output and providing the inverted second output to the drain of the first transistor and the fourth transistor of the third plurality of transistors.

\* \* \* \* \*